United States Patent [19]

Sumita et al.

[11] Patent Number: 4,496,871
[45] Date of Patent: Jan. 29, 1985

[54] PARALLEL TYPE PIEZOELECTRIC BIMORPH VIBRATOR

[75] Inventors: Manabu Sumita, Kanazu; Toshiaki Yamashita, Kanazawa, both of Japan

[73] Assignee: Murata Manufacturing Co., Ltd., Nagaokakyo, Japan

[21] Appl. No.: 526,128

[22] Filed: Aug. 24, 1983

[30] Foreign Application Priority Data

Aug. 27, 1982 [JP] Japan .......................... 57-130238[U]

[51] Int. Cl.³ ............................................ H01L 41/08
[52] U.S. Cl. ...................................... 310/324; 310/332
[58] Field of Search ...................... 310/332, 331, 324; 179/110 A; 340/384 E

[56] References Cited

U.S. PATENT DOCUMENTS

| Re. 20,680 | 3/1938 | Sawyer | 310/332 |
| 2,484,428 | 10/1949 | Smith | 310/353 X |
| 3,069,572 | 12/1962 | Dick et al. | 310/353 |
| 3,360,664 | 12/1967 | Straube | 310/332 X |
| 3,439,128 | 4/1969 | Sobel et al. | 310/324 X |
| 4,122,365 | 10/1978 | Stephens | 310/324 |

Primary Examiner—Mark O. Budd
Attorney, Agent, or Firm—Wenderoth, Lind & Ponack

[57] ABSTRACT

A parallel type piezoelectric bimorph vibrator is used for a piezoelectric buzzer or a piezoelectric loudspeaker, which is cemented at both ends of a conductive diaphragm together with piezoelectric elements, and is provided at part of the outer periphery of a diaphragm with a cutout, the outer peripheries of the piezoelectric elements facing the cutout. Electrodes outside both the piezoelectric elements are connected by a conductor at the position corresponding to the cutout, so that the existence of the cutout prevents the conductor from being brought into contact with the diaphragm.

6 Claims, 10 Drawing Figures

PARALLEL TYPE PIEZOELECTRIC BIMORPH VIBRATOR

BACKGROUND OF THE INVENTION

1. Field of the Invention

This invention relates to an improvement in a parallel type piezoelectric bimorph vibrator used for a piezoelectric buzzer or a piezoelectric loudspeaker.

2. Description of Prior Art

Conventionally, the parallel type piezoelectric bimorph vibrator generally used, as shown in FIG. 1, fundamentally comprises a diaphragm 11 of round metallic plate metal and piezoelectric elements 12 somewhat smaller in diameter than the diaphragm 11 and cemented on both sides thereof.

Both the piezoelectric elements 12 each are made of piezoelectric ceramic or the like, provided at both sides with electrodes 13 of silver or the like, and are arranged in the same direction. The outside electrode 13 at each piezoelectric element 12 is connected by a lead wire 14. The inside electrode 13 at the same piezoelectric element 12 is brought into contact with the diaphragm 11 connected with a lead wire 15, so that the lead wire 15 and a lead wire 16 connected with the lead wire 14 are connected to an oscillator. Plus and minus voltages are alternately applied to the electrodes 13 at both the piezoelectric elements 12 to thereby generate vibrations.

Such a parallel type piezoelectric bimorph vibrator, as abovementioned, has the diaphragm 11 made larger in diameter than each piezoelectric element 12, the diaphragm 11 and piezoelectric elements 12 being fixed concentrically with each other.

Accordingly, the lead wire 14 connecting the outside electrodes 13 of both the piezoelectric elements 12 is adapted to contact the outer periphery of diaphragm 11, thereby creating a problem in that the contact causes trouble with respect to vibrations.

Hence, a remedy is required to prevent the lead wire 14 from contacting the diaphragm 11. Several means, which have hitherto been adopted to prevent the above contact, are shown in FIGS. 2 through 4.

In FIG. 2, a ring-like spring 17 is used as the lead wire 16 connecting the outside electrodes 13. In FIG. 3, a clip-like spring 18 is substituted for the lead wire. In FIG. 4, the diaphragm 11 is eccentric from the piezoelectric elements 12 to thereby retract the spring 18 at the side connecting the outside electrodes 13.

In all the above cases, the prevention of contact is incomplete so that the spring 17 or 18 still may make contact with the diaphragm 11. Hence, the diaphragm 11 or spring 17 or 18 is coated with an insulating material. Such coating, however, increases the process steps in number. The regular eccentricity of these members during the manufacturing process is very difficult to control, and the frequency characteristic is not kept proper.

SUMMARY AND OBJECTS OF THE INVENTION

An object of the invention is to provide a parallel type piezoelectric bimorph vibrator which has no possibility that a conductor connecting the outside electrodes of piezoelectric elements cemented with both surfaces of a diaphragm is brought into contact therewith.

Another object of the invention is to provide a parallel type piezoelectric bimorph vibrator being simple to manufacture and keeping constant the frequency characteristic.

These and other objects, features and advantages of the invention will become more apparent upon a reading of the following detailed description in view of the drawings.

DETAILED DESCRIPTION OF THE PREFERRED EMBODIMENT

Figure 1:
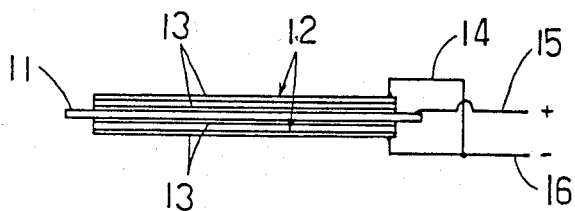
FIG. 1 is a basic structural side view of a conventional parallel type piezoelectric bimorph vibrator.
Figure 2:
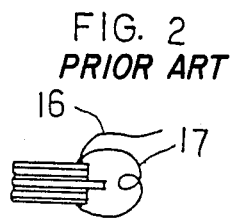
FIG. 2 is a side view of a first example of a lead wire contact prevention means for the conventional vibrator.
Figure 3:
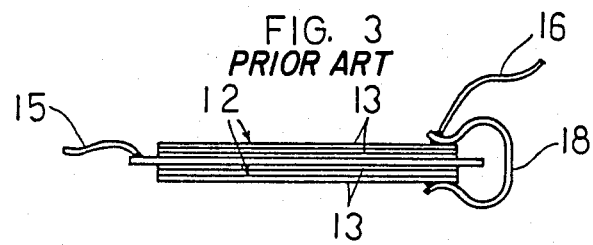
FIG. 3 is a side view of a second example of a lead wire contact prevention means for the conventional vibrator.
Figure 4:
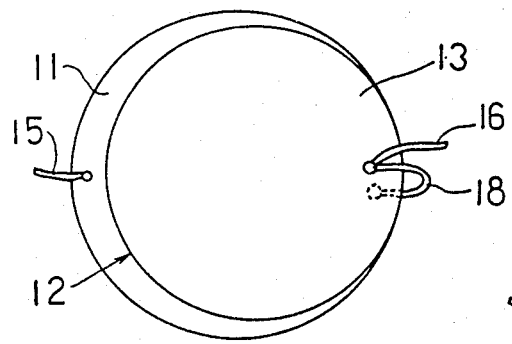
FIG. 4 is a plan view of a third example of a lead wire contact prevention means for the conventional vibrator.
Figure 5:
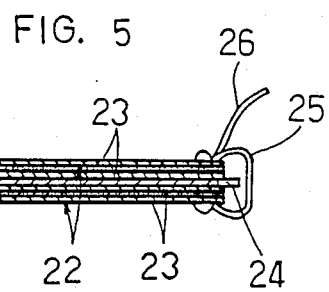
FIG. 5 is a longitudinal sectional view of a first embodiment of a parallel type piezoelectric bimorph vibrator of the invention.
Figure 6:
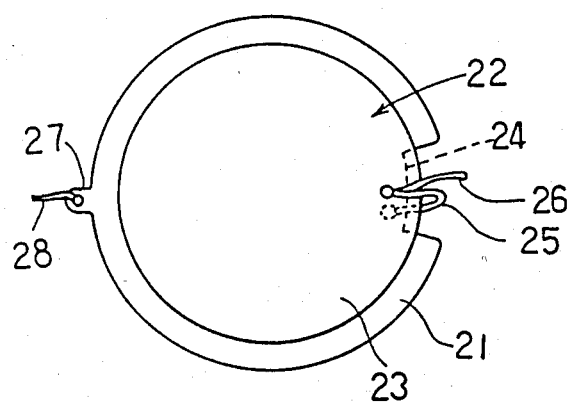
FIG. 6 is a plan view of the first embodiment.

A first embodiment of a parallel type piezoelectric bimorph vibrator of the invention is shown in FIGS. 5 and 6, in which a diaphragm 21 and piezoelectric elements 22 are cemented with adhesives substantially concentrically with each other and a cutout 24 is provided at part of the outer periphery of diaphragm 21, the cutout 24 being positioned at the inner edge thereof radially inwardly from the outer periphery of each piezoelectric element 22.

For preventing the diaphragm 21 from contacting a conductor to be discussed below, it is preferable that the inner edge of the cutout 24 enters radially inwardly from the outer periphery of each piezoelectric element 22 by, for example, about 0.5 to 1.0 mm.

Each piezoelectric element 22 is provided at both surfaces with outside and inside electrodes 23, the inside electrodes 23 being overlapped with the surfaces of diaphragm 21 and being in contact therewith, the outside electrodes 23 being connected electrically with each other through the conductor 25 at the portions corresponding to the cutout 24.

The conductor 25 employs an ordinary lead wire and is positioned within the cutout 24 so as not to contact the diaphragm 21.

Also, the conductor 25 connects with a lead wire 26 and the diaphragm 21 is provided at part of the outer periphery thereof with a projection 27 so that a lead wire 28 connects with the projection 27 and with the inside electrode 23 at each piezoelectric element 22 through the diaphragm 21. Alternatively, the projection 27 may be omitted and the lead wire 28 may connect directly with part of the outer periphery of diaphragm 21. In addition, the conductor 25 and lead wires 26 and 28 are connected by soldering or the like.

Figure 7:
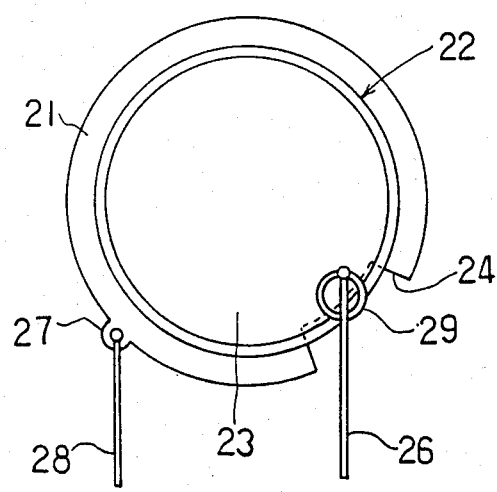
FIG. 7 is a plan view of a second embodiment of the invention.
Figure 8:
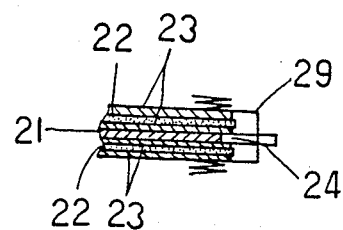
FIG. 8 is a partial side view of the second embodiment.

Next, a second embodiment of the invention will by shown in FIGS. 7 and 8, in which a coiled spring terminal 29 is used for a conductor which is fitted onto both piezoelectric elements 22 so as to sandwich them together, thereby connecting the outside electrodes 23 at the position corresponding to cutout 24.

Also, the cutout 24 is positioned in proximity to the projection 27, thereby enabling both the lead wires 26 and 28 to be drawn out in parallel to each other.

Figure 9:
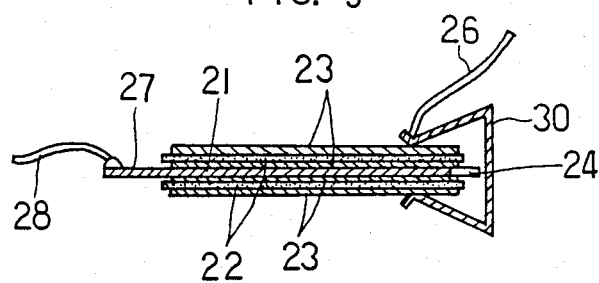
FIG. 9 is a longitudinal sectional side view of a third embodiment of the invention.
Figure 10:
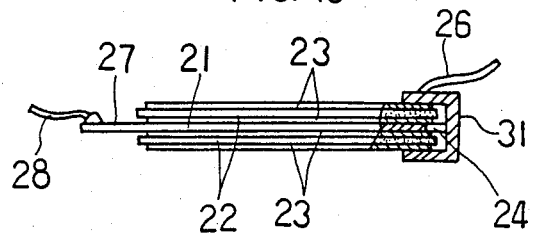
FIG. 10 is a longitudinal sectional view of a fourth embodiment of the invention.

A third embodiment of the invention shown in FIG. 9 and a fourth embodiment shown in FIG. 10 employ as the conductors clip-like-shaped spring terminals 30 and 31 different in shape respectively.

As seen from the above discussion, this invention provides the cutout at a part of the diaphragm so that the outside electrodes of both the piezoelectric elements are connected by the conductor, such as a lead wire, at the portions corresponding to the cutout. Hence, there is no fear of bringing the conductor into contact with the diaphragm at the position corresponding to the cutout.

Accordingly, the piezoelectric elements and diaphragm can be concentric with each other, whereby the piezoelectric bimorph vibrator of the invention is advantageous in that the manufacturing schedule is easy to control and the frequency characteristic can be kept constant.

Although several embodiments have been described, they are merely exemplary of the invention and are not to be constructed as limiting, the invention being defined solely by the appended claims.

What is claimed is:

1. A parallel type piezoelectric bimorph vibrator comprising:
   a diaphragm,
   piezoelectric elements fixed to both surfaces of said diaphragm,
   outside electrodes mounted at said piezoelectric elements, and
   a conductor connected to outer peripheries of said outside electrodes,
   said diaphragm being provided at a part of its outer periphery with a cutout portion,
   said outside electrodes at said piezoelectric elements being connected by the conductor at said cutout portion,
   wherein said cutout portion provided at the outer periphery of said diaphragm is formed to a depth beyond the outer periphery of each of said piezoelectric elements radially inwardly thereof so that the cutout portion prevents the conductor from contacting the diaphragm.

2. A parallel type piezoelectric bimorph vibrator according to claim 1, wherein said conductor also is connecting said outside electrodes at said piezoelectric elements, is formed with a lead wire, and is soldered to said outside electrodes.

3. A parallel type piezoelectric bimorph vibrator according to claim 1, wherein said conductor is formed in the shape of a coiled spring terminal.

4. A parallel type piezoelectric bimorph vibrator according to claim 1, wherein said conductor is formed in the shape of a clip-like-shaped spring terminal.

5. A parallel type piezoelectric bimorph vibrator according to claim 1, wherein said diaphragm and said piezoelectric elements are fixed concentrically with each other.

6. A parallel type piezoelectric bimorph vibrator according to claim 1, wherein a projection means for connecting a lead wire is provided at the outer periphery of said diaphragm.

* * * * *